United States Patent
Tomisato et al.

(10) Patent No.: US 7,123,084 B2
(45) Date of Patent: Oct. 17, 2006

(54) SEMICONDUCTOR INTEGRATED CIRCUIT AND DESIGNING METHOD FOR SAME

(75) Inventors: Nobuaki Tomisato, Kawasaki (JP); Yasuhiko Inada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 144 days.

(21) Appl. No.: 10/964,638

(22) Filed: Oct. 15, 2004

(65) Prior Publication Data
US 2005/0285668 A1 Dec. 29, 2005

(30) Foreign Application Priority Data
Jun. 24, 2004 (JP) ............................. 2004-186209

(51) Int. Cl.
*H01L 25/00* (2006.01)
(52) U.S. Cl. .................................... 327/565
(58) Field of Classification Search ............... 327/564, 327/565
See application file for complete search history.

(56) References Cited
U.S. PATENT DOCUMENTS
5,453,713 A * 9/1995 Partovi et al. .............. 327/565
6,430,735 B1 * 8/2002 Uchida ......................... 716/12

FOREIGN PATENT DOCUMENTS
JP   4-56355   2/1992
JP   5-48048   2/1993

* cited by examiner

*Primary Examiner*—Jeffrey Zweizig
(74) *Attorney, Agent, or Firm*—Arent Fox PLLC

(57) ABSTRACT

A power supply cell is arranged in the corner of a rectangular semiconductor chip. A first or second power supply voltage is supplied to a pad of the power supply cell. A first connecting line of the power supply cell connects a first power supply line in an input/output cell area to a first power supply line in a power supply line area. A second connecting line of the power supply cell connects a second power supply line in the input/output cell area to a second power supply line in the power supply line area. A leadout line of the power supply cell connects the first or second connecting line to the pad.

2 Claims, 4 Drawing Sheets

SEMICONDUCTOR INTEGRATED CIRCUIT AND DESIGNING METHOD FOR SAME

CROSS REFERENCE TO RELATED APPLICATION

This application is based upon and claims the benefit of priority from Japanese Patent Application No. 2004-186209, filed on Jun. 24, 2004, the entire contents of which are incorporated herein by reference.

BACKGROUND OF THE INVENTION

1. Field of the Invention

The present invention relates to a semiconductor integrated circuit and a designing method therefor; more particularly, to a semiconductor integrated circuit formed of a semiconductor chip having input/output cells arranged only along two sides thereof facing to each other and to a designing method therefor.

2. Description of the Related Art

There is a known technique for increasing the number of input/output cells arrangeable on a semiconductor chip of a semiconductor integrated circuit which is formed of the semiconductor chip having input/output cells arranged along an outer periphery thereof. For example, Japanese Unexamined Patent Application Publication No. Hei 4-56355 has disclosed a semiconductor integrated circuit in which a power supply line has linear portions on input/output cells arranged along an outer periphery of a semiconductor chip and curved portions along corners of the semiconductor chip. The curved portions of the power supply line are smaller in width than the linear portions and are formed in multilayers. This makes it possible to form the input/output cells also in areas near the corners of the semiconductor chip. As a result, a larger number of input/output cells can be arranged on the semiconductor chip.

Further, Japanese Unexamined Patent Application Publication No. Hei 5-48048 has disclosed a semiconductor integrated circuit in which four input/output cell areas are formed by arranging input/output cells outside a basic cell area in parallel with each of four sides surrounding the basic cell area. A corner area of two joining sides is shared by two input/output cell areas, and input/output cells forming one of the input/output cell areas are arranged therein. A metal power supply line on one of the input/output cell areas does not have any connecting terminal to electrically connect to a metal power supply line on the other input/output cell area. Such a configuration enables efficient arrangement of a large number of input/output cells on a semiconductor chip.

In case of a semiconductor integrated circuit having a small number of input/output cells (namely, external input/output terminals), the input/output cells are often arranged only along two sides of a semiconductor chip facing to each other due to easiness in terms of manufacturing or the like. However, Japanese Unexamined Patent Application Publication Nos. Hei 4-56355 and Hei 5-48048 have disclosed a technique for forming a semiconductor integrated circuit with a semiconductor chip having input/output cells arranged along all the four sides thereof, but not one with a semiconductor chip having input/output cells arranged only along two opposite sides thereof.

SUMMARY OF THE INVENTION

It is an object of the present invention to make effective use of an area on a semiconductor chip with input/output cells arranged only along two opposite sides thereof in a semiconductor integrated circuit.

According to one of the aspects of the semiconductor integrated circuit of the present invention, first and second input/output cell areas are formed of input/output cells arranged along first and second sides of a rectangular semiconductor chip, respectively. Here, the first and second sides are two opposite sides of the semiconductor chip. First and second power supply lines in the first input/output cell area are wired along the first side. First and second power supply lines in the second input/output cell area are wired along the second side. A power supply line area includes first and second power supply lines that are wired along a third side of the semiconductor chip to connect the first and second power supply lines in the first input/output cell area to the first and second power supply lines in the second input/output cell areas, respectively. Here, the third side connects the first and second sides of the semiconductor chip. A power supply cell is arranged in at least one of a corner of the first and third sides and a corner of the second and third sides. A pad of the power supply cell is supplied with one of first and second power supply voltages. A first connecting line of the power supply cell connects the first power supply line in one of the first and second input/output cell areas to the first power supply line in the power supply line area. A second connecting line of the power supply cell connects the second power supply line in one of the first and second input/output cell areas to the second power supply line in the power supply line area. A leadout line of the power supply cell connects one of the first and second connecting lines to the pad.

Arranging the power supply cell in at least one of the corners can eliminate unused areas (in which nothing is formed) in the corners. Further, compared with a case where the power supply cell is disposed between the input/output cells, it is possible to increase an area in which function blocks are placed and routed by an amount corresponding to the area for arrangement of the power supply cell on a semiconductor chip of the same size. Accordingly, it is possible to make effective use of the area on the semiconductor chip.

According to a preferable example of the above-described aspect of the semiconductor integrated circuit of the present invention, the power supply cell are disposed in both of the corners of the first and third sides and of the second and third sides. A pad of one of the power supply cells is supplied with the first power supply voltage. A leadout line of one of the power supply cells connects a first connecting line to the pad. A pad of the other power supply cell is supplied with the second power supply voltage. A leadout line of the other power supply cell connects a second connecting line to the pad. The arrangement of the power supply cells in both of the corners of the first and third sides of the second and third sides can further increase an area in which the function blocks are placed and routed and thereby contribute to more effective use of the area on the semiconductor chip.

According to one of the aspects of the designing method for a semiconductor integrated circuit, a computer for designing a semiconductor integrated circuit performs the following processings. First, layout information containing sizes of an input/output cell in first and second directions perpendicular to each other and circuit information on first and second function blocks are inputted (first step). Next, input/output cells are arranged along two sides of a rectangular semiconductor chip in the first direction in an area on one side of the semiconductor chip (second step).

Next, in an area between arrays of the input/output cells arranged to face to each other in the second step, placement and routing are performed for the first function block while a size of the first function block in the first direction is being fixed to a size of one of the input/output cell arrays in the first direction. The placement and routing for the first function block determines a size of the first function block in the second direction, so that a size of the semiconductor chip in the second direction will be the sum of a size of one of the input/output cell arrays in the second direction, a size of the other input/output cell array in the second direction, and the size of the first function block in the second direction determined by performing the placement and routing for the first function block (third step).

Thereafter, placement and routing are performed for the second function block in an area on the other side of the semiconductor chip in the first direction while a size of the second function block in the second direction is being fixed to a size corresponding to the size of the semiconductor chip in the second direction determined in the third step. The placement and routing for the second function block determines a size of the second function block in the first direction, so that a size of the semiconductor chip in the first direction will be, for example, the sum of the size of one of the input/output cell arrays in the first direction and the size of the second function block in the first direction determined by performing the placement and routing for the second function block (fourth step).

According to the designing method for a semiconductor integrated circuit as described above, minimizing the size of the first function block in the second direction at the placement and routing for the first function block results in minimizing the size of the semiconductor chip in the second direction in a possible range. Also, minimizing the size of the second function block in the first direction at the placement and routing for the second function block results in minimizing the size of the semiconductor chip in the first direction in a possible range. Therefore, it is possible to easily determine the minimum size of the semiconductor chip and thereby contribute to chip size reduction.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
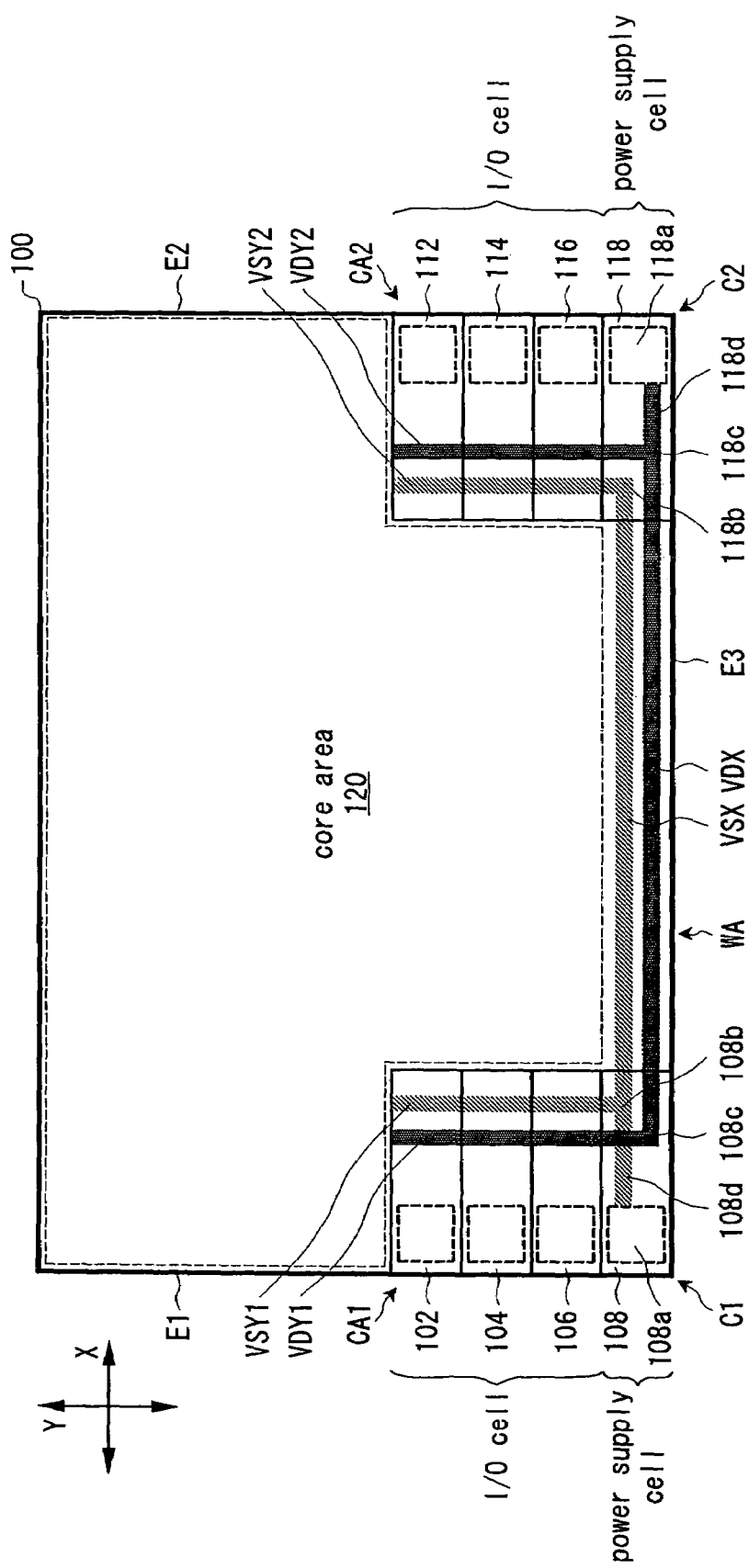
FIG. 1 is an explanatory diagram showing an embodiment of the semiconductor integrated circuit of the present invention.

Hereinafter, an embodiment of the present invention will be described with reference to the drawings. FIG. 1 shows an embodiment of the semiconductor integrated circuit of the present invention. A semiconductor integrated circuit 100 (semiconductor chip) includes a first input/output cell area CA1 in which input/output cells (I/O cells) 102, 104, 106 for exchanging signals with an exterior are arranged, a second input/output cell area CA2 in which input/output cells 112, 114, 116 are arranged, power supply cells 108, 118 supplied with a power supply voltage from an exterior, a core area 120 in which function blocks such as a logic block and a memory block are arranged, first power supply lines VSY1, VSY2 and second power supply lines VDY1, VDY2, and a power supply line area WA in which a first power supply line VSX and a second power supply line VDX are laid.

Each of the input/output cells 102, 104, 106 of the input/output cell area CA1 includes a pad (dotted square in the drawing), protective elements and input/output logic circuits (which are not shown), and so on, and they are arranged in array along a first side E1 extending in a Y direction (vertical direction in the drawing) in the rectangular semiconductor chip 100. The power supply lines VSY1, VDY1 are laid along the side E1 to vertically cross over the input/output cells 102, 104, 106.

Each of the input/output cells 112, 114, 116 of the input/output cell area CA2 includes a pad, protective elements, input/output logic circuits, and so on, and they are arranged in array along a second side E2 extending in the Y direction of the semiconductor chip 100. The power supply lines VSY2, VDY2 are laid along the side E2 to vertically cross over the input/output cells 112, 114, 116. The power supply lines VSX, VDX of the power supply line area WA are laid along a third side E3 extending in an X direction (horizontal direction in the drawing) of the semiconductor chip 100, the power supply line VSX electrically connecting the power supply lines VSY1, VSY2 to each other and the power supply line VDX electrically connecting the power supply lines VDY1, VDY2 to each other.

The power supply cell 108 is arranged in a corner portion C1 in the vicinity of a intersection of the sides E1, E3 of the semiconductor chip 100 and it has a pad 108a, a first connecting line 108b, a second connecting line 108c, and a leadout line 108d. The pad 108a is supplied with a ground voltage VSS (first power supply voltage) from an exterior. The connecting line 108b electrically connects the power supply lines VSY1, VSX to each other and the connecting line 108c electrically connects the power supply lines VDY1, VDX to each other. The leadout line 108d electrically connects the pad 108a to the connecting line 108b.

The power supply cell 118 is arranged in a corner portion C2 in the vicinity of a intersection of the sides E2, E3 of the semiconductor chip 100, and it has a pad 118a, a first connecting line 118b, a second connecting line 118c, and a leadout line 118d. The pad 118a is supplied with a power supply voltage VDD (second power supply voltage) from an exterior. The connecting line 118b electrically connects the power supply lines VSY2, VSX to each other and the connecting line 118c connects the power supply lines VDY2, VDX to each other. The leadout line 118d electrically connects the pad 118a to the connecting line 118c.

The power supply cells 108, 118 are thus arranged in the corner portions C1, C2 respectively, so that there is substantially no unused area (dead space) in the corner portions C1, C2. Further, the core area 120 is larger by an amount corresponding to the areas of the power supply cells than when the power supply cells are arranged between the input/output cells. This enables the formation of a larger scale logic block and memory block if the chip size of the semiconductor chip 100 is the same. In other words, with the same circuit scale of the logic block and memory block on the semiconductor chip 100, the chip size of the semiconductor chip 100 can be reduced. Therefore, the application of the present invention realizes effective use of the area on the semiconductor chip 100.

Figure 2:
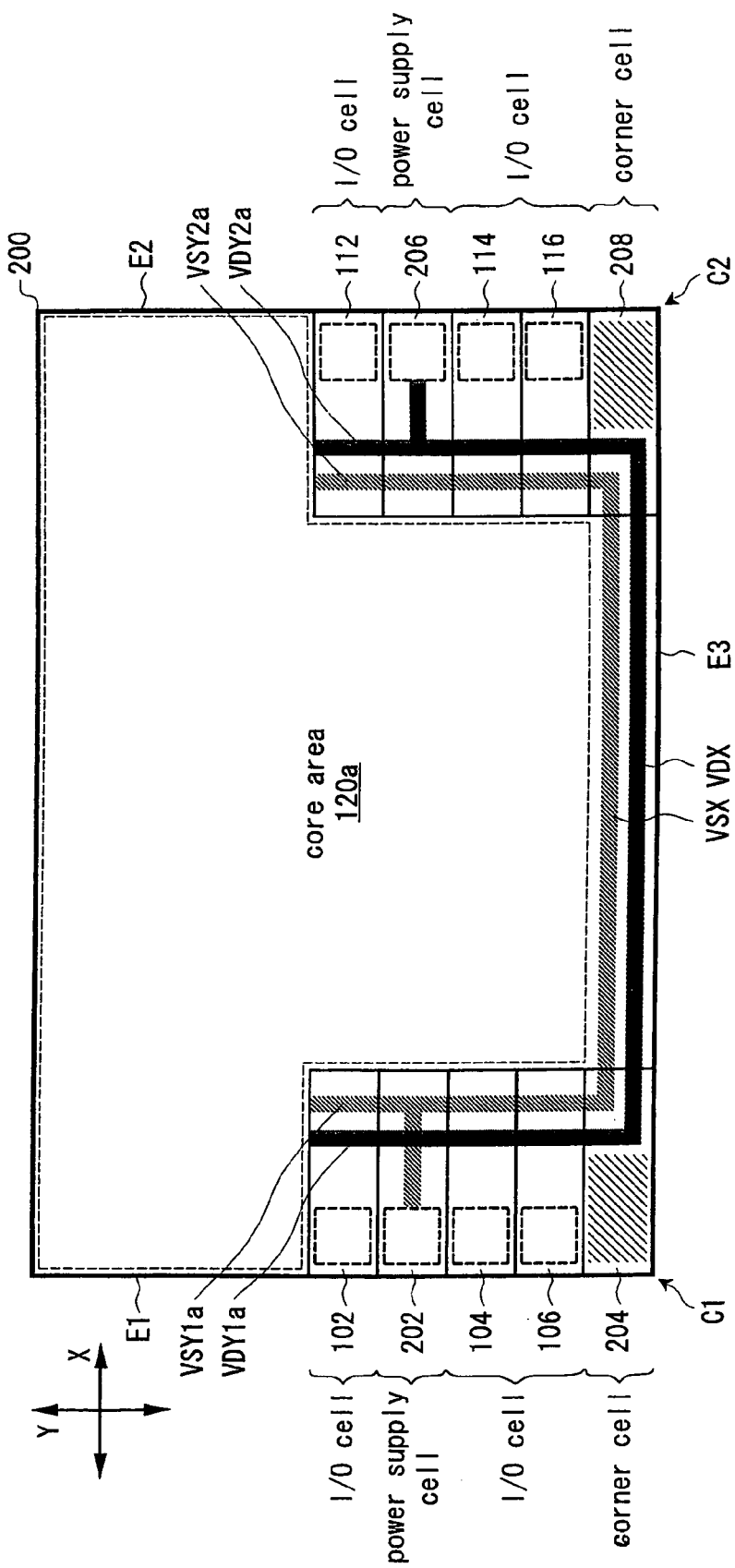
FIG. 2 is an explanatory diagram showing a comparative example of the semiconductor integrated circuit in FIG. 1.

FIG. 2 shows a comparative example of the semiconductor integrated circuit 100 in FIG. 1. The same reference numerals and symbols are used to designate the same elements as the elements described in FIG. 1, and detailed description thereof will not be given. In a semiconductor integrated circuit 200, a power supply cell 202 is arranged between input/output cells 102, 104, and it has a pad for the supply of a ground voltage VSS and a leadout line electrically connecting the pad and a power supply line VSY1a to each other. A corner cell 204 is arranged in a corner portion C1 and it has two connecting lines, one electrically connecting the power supply line VSY1a and a power supply line VSX to each other and the other electrically connecting power supply lines VDY1a and VDX to each other. A power supply cell 206 is arranged between input/output cells 112, 114, and it has a pad for the supply of a power supply voltage VDD and a leadout line electrically connecting the pad and a power supply line VDY2a to each other. A corner cell 208 is arranged in a corner portion C2, and it has two connecting lines, one electrically connecting a power supply line VSY2a and the power supply line VSX to each other and the other electrically connecting the power supply lines VDY2a and VDX to each other.

In the semiconductor integrated circuit 200 as structured above, nothing is formed in an area in the corner cells 204, 208 except the connecting lines. Therefore, there are unused areas (hatched portions in the drawing) in the corner cells 204, 208, and it cannot be said that the area on the semiconductor chip 200 is effectively used. The semiconductor integrated circuit is required to have a semiconductor chip of very small size, and unuse of even a minute area is not acceptable. Therefore, the presence of the dead space in the corner cells 204, 208 will be a critical disadvantage.

Figure 3:
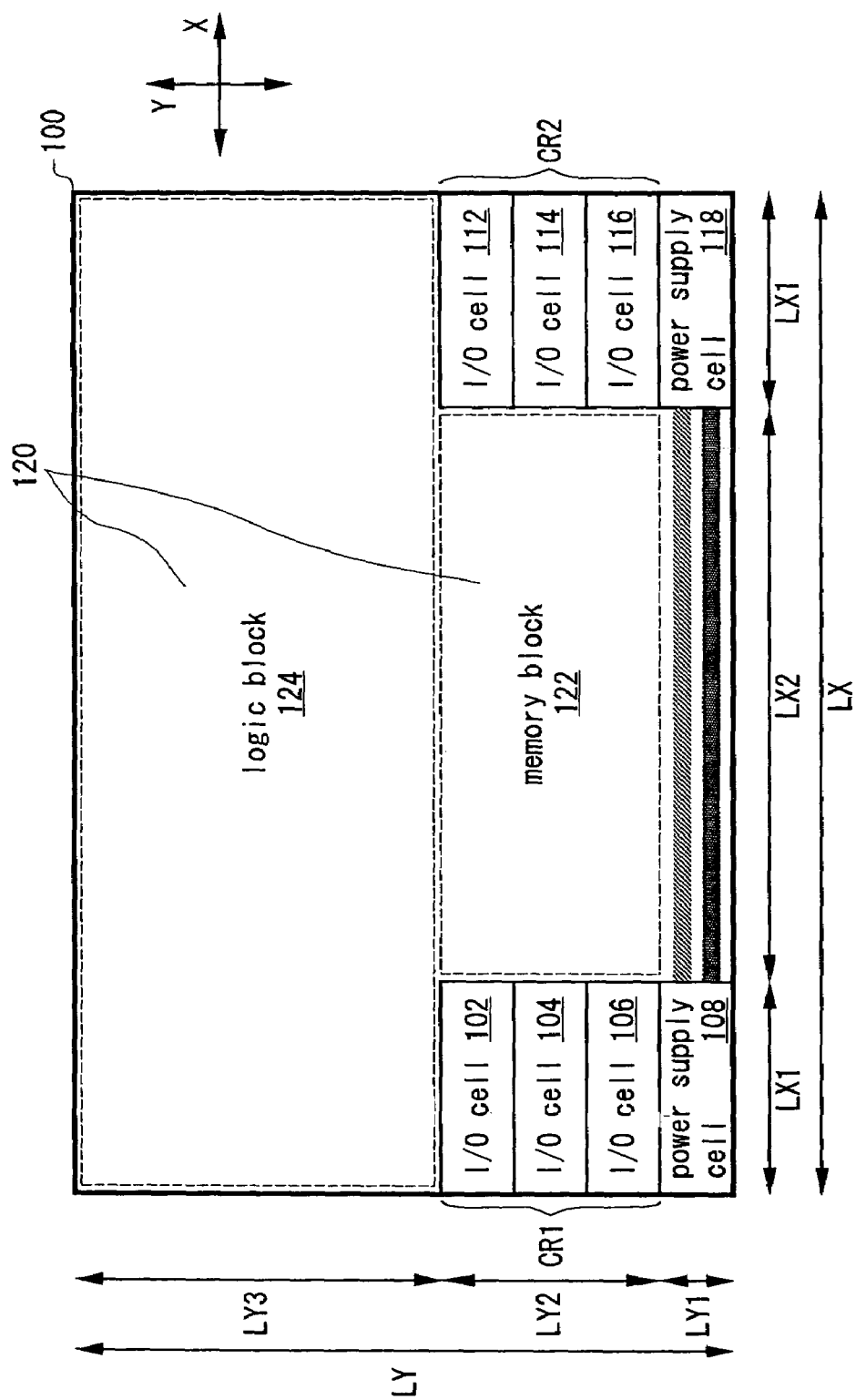
FIG. 3 is an explanatory diagram showing a designing method for the semiconductor integrated circuit in FIG. 1.
Figure 4:
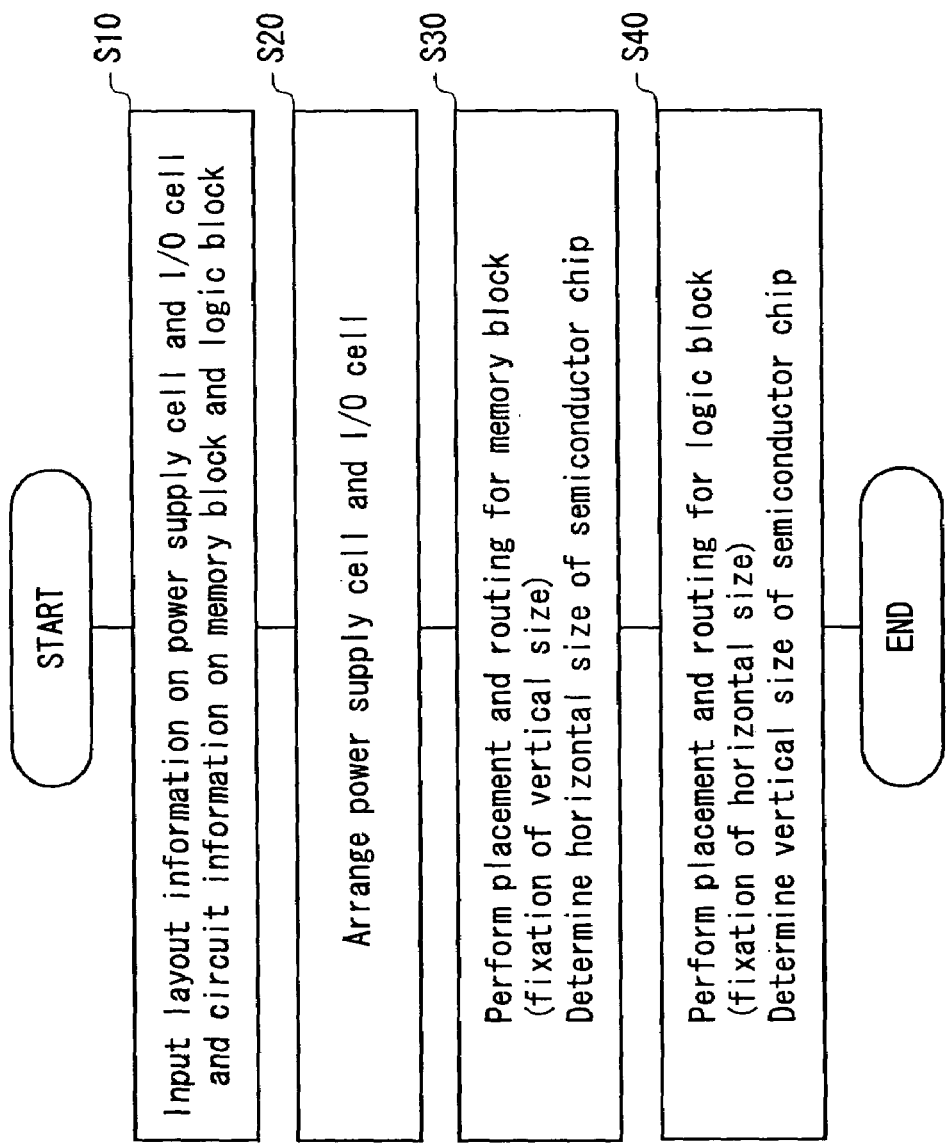
FIG. 4 is a flowchart showing the designing method for the semiconductor integrated circuit in FIG. 1.

FIG. 3 and FIG. 4 show a designing method for the semiconductor integrated circuit 100 in FIG. 1. Note that the core area 120 in FIG. 1 is composed of a memory block 122 (first function block) and a logic block 124 (second function block). Further, the input/output cells 102, 104, 106, 112, 114, 116 and the power supply cells 108, 118 have the same Y-direction (first direction) size (vertical size) and the same X-direction (second direction) size (horizontal size). The designing method described below will be performed by, for example, a work station.

First, layout information including the vertical and horizontal sizes of the input/output cells 102, 104, 106, 112, 114, 116 and the power supply cells 108, 118 and circuit information (netlist, timing restrictions, and the like) on the memory block 122 and the logic block 124 are inputted (Step S1 in FIG. 4). Next, in an area on one end side of the semiconductor chip 100 in the Y direction (the lower side in the drawing), the input/output cells 102, 104, 106 and the power supply cell 108 are arranged along the side E1, and the input/output cells 112, 114, 116 and the power supply cell 118 are arranged along the side E2 (Step S20 in FIG. 4).

Next, in an area between an input/output cell array CR1 (formed of the input/output cells 102, 104, 106) and an input/output cell array CR2 (formed of the input/output cells 112, 114, 116), the placement and routing are performed for the memory block 122 with a vertical size of the memory block 122 kept fixed to a vertical size LY2 of the input/output cell array CR1 (CR2). For example, the placement and routing are performed for the memory block 122 while the vertical size thereof is being fixed, changing a horizontal size thereof according to verification results of routability, timing, and the like. Accordingly, a horizontal size of the semiconductor chip 100 will be a sum LX of a horizontal size LX1 of the input/output cell 102, the horizontal size LX1 of the input/output cell 112, and a horizontal size LX2 determined by the placement and routing for the memory block 122 (Step S30 in FIG. 4). When the memory block 122 is preset as hard macro, the horizontal size of the semiconductor chip 100 may be determined by arranging the hard macro in the area between the input/output cell arrays CR1, CR2, not by performing the placement and routing for the memory block 122.

Thereafter, in an area on the other end side of the semiconductor chip 100 in the Y direction (the upper side in the drawing), the placement and routing are performed for the logic block 124 with a horizontal size of the logic block 124 kept fixed to the horizontal size LX of the semiconductor chip 100 determined by the placement and the routing for the memory block 122. For example, the placement and routing are performed for the logic block 124 with the horizontal size thereof kept fixed, changing a vertical size thereof according to verification results of routability, timing, and the like. Accordingly, a vertical size of the semiconductor chip 100 will be a sum LY of a vertical size LY1 of the power supply cell 108 (118), a vertical size LY2 of the input/output cell array CR1 (CR2), and a vertical size LY3 determined by the placement and routing for the logic block 124 (Step S40 in FIG. 4).

According to the designing method as described above, minimizing the horizontal size LX2 of the memory block 122 at the placement and routing for the memory block 122 means minimizing the horizontal size LX of the semiconductor chip 100 in a possible range. Also, minimizing the vertical size LY3 of the logic block 124 at the placement and routing for the logic block 124 means minimizing the vertical size LY of the semiconductor chip 100 in a possible range. Therefore, it is easy to determine the minimum chip size of the semiconductor chip 100. This results in contributing to chip size reduction of the semiconductor chip 100. Further, when the chip size is to be changed due to a change in circuit scale or the like of the memory block 122 or the logic block 124 in the semiconductor integrated circuit 100 designed by the above-described designing method, the wiring of the power supply lines can be changed only by changing the length of the power supply lines VSX, VDX so as to match with the horizontal size LX2 of the memory block 122, which can enhance design efficiency.

As described hitherto, according to this embodiment, it is possible to eliminate dead space in the corner portions C1, C2 owing to the arrangement of the power supply cells 108, 118 in the corner portions C1, C2, and to increase the core area 120 compared with that when the power supply cells are arranged between the input/output cells (the semiconductor integrated circuit 200 in FIG. 2), so that the area on the semiconductor chip 100 can be effectively used. With an actual application of the present invention to a semiconductor integrated circuit having a logic block of about 8000 gates, it was able to attain a great effect that a core area is made larger by an area corresponding to about 1400 gates (corresponding to two input/output cells) than that in a semiconductor integrated circuit with a chip of the same size having power supply cells arranged between input/output cells.

Further, performing the placement and routing for the memory block 122 and for the logic block 124 with the vertical sizes or the horizontal sizes fixed makes it possible to determine the minimum chip size of the semiconductor chip 100 with easiness and to contribute to chip size reduction. Moreover, if chip size has to be changed due to a change in circuit scale or the like of the memory block 122 or the logic block 124, the wiring of the power supply lines can be easily changed, which can shorten the time taken for designing.

The above-described embodiment has described an example where the input/output cell areas CA1, CA2 are formed of the same number of the input/output cells. However, the present invention is not to be limited thereto. For example, the numbers of respective input/output cells forming the input/output cell areas CA1 and CA2 may be different from each other unless the difference is large (for example, 9 and 10 pieces).

The above-described embodiment has described an example where the power supply cells 108, 118 are arranged in the corner portions C1, C2 respectively. However, the present invention is not to be limited thereto. For example, the power supply cell may be arranged only in one of the corner portions C1, C2. Specifically, when the input/output cell areas CA1 and CA2 are formed of different numbers of input/output cells, it is effective to dispose the power supply cell in the corner portion of the input/output cell area formed of a larger number of input/output cells.

The invention is not limited to the above embodiments and various modifications may be made without departing from the spirit and scope of the invention. Any improvement may be made in part or all of the components.

What is claimed is:

1. A semiconductor integrated circuit formed of a rectangular semiconductor chip having input/output cells arranged only along first and second sides thereof facing to each other, comprising:

first and second input/output cell areas formed of input/output cells arranged along the first and second sides, respectively;

first and second power supply lines wired along the first side in said first input/output cell area;

first and second power supply lines wired along the second side in said second input/output cell area;

a power supply line area including first and second power supply lines that are wired along a third side of the semiconductor chip and connect the first and second power supply lines in said first input/output cell area to the first and second power supply lines in said second input/output cell area, respectively, the third side connecting the first and second sides; and a power supply cell disposed in at least one of a corner of the first and third sides and a corner of the second and third sides, wherein said power supply cell comprises: a pad for supply of one of first and second power supply voltages; a first connecting line connecting the first power supply line in one of said first and second input/output cell areas to the first power supply line in said power supply line area; a second connecting line connecting the second power supply line in one of said first and second input/output cell areas to the second power supply line in said power supply line area; and a leadout line connecting one of the first and second connecting lines to the pad.

2. The semiconductor integrated circuit according to claim 1, wherein:

the power supply cell is disposed in both of the corners of the first and third sides and of the second and third sides;

one of the power supply cells has a pad for supply of the first power supply voltage and a leadout line connecting a first connecting line to the pad; and the other power supply cell has a pad for supply of the second power supply voltage and a leadout line connecting a second connecting line to the pad.

* * * * *